United States Patent
Guzman et al.

(10) Patent No.: US 10,921,354 B2
(45) Date of Patent: Feb. 16, 2021

(54) POWER GRID ELECTRIC TRANSIENT DETECTOR, METHOD FOR DETECTING POWER GRID ELECTRIC TRANSIENTS AND ELECTRIC MANAGEMENT SYSTEM WITH POWER GRID ELECTRIC TRANSIENT DETECTION

(71) Applicants: 3R VALO, LIMITED PARTNERSHIP, Montreal (CA); HYDRO-QUÉBEC, Montreal (CA)

(72) Inventors: Cristina Guzman, Trois-Rivières (CA); Alben Cardenas, Trois-Rivières (CA); Kodjo Mawupe Agbossou, Trois-Rivières (CA); Michaël Fournier, Trois-Rivières (CA); Éric Le Courtois, Shawinigan (CA)

(73) Assignees: 3R VALO LIMITED PARTNERSHIP, Montreal (CA); HYDRO QUEBEC, Montreal (CA)

( * ) Notice: Subject to any disclaimer, the term of this patent is extended or adjusted under 35 U.S.C. 154(b) by 301 days.

(21) Appl. No.: 15/969,828

(22) Filed: May 3, 2018

(65) Prior Publication Data
US 2019/0339311 A1    Nov. 7, 2019

(51) Int. Cl.
| | | |
|---|---|---|
| *G01R 21/133* | (2006.01) | |
| *H02J 13/00* | (2006.01) | |
| *G05B 19/042* | (2006.01) | |
| *G01R 19/02* | (2006.01) | |

(52) U.S. Cl.
CPC ......... *G01R 21/133* (2013.01); *G01R 19/02* (2013.01); *G05B 19/042* (2013.01); *H02J 13/0006* (2013.01); *G05B 2219/21109* (2013.01)

(58) Field of Classification Search
CPC ...... G06Q 50/06; H02J 13/00002; H02J 3/00; H02J 13/0006; G05B 2219/21109; G05B 19/042; G01R 19/02; G01R 21/133; G01R 19/1658; G01R 19/2513
See application file for complete search history.

(56) References Cited

U.S. PATENT DOCUMENTS

| | | | |
|---|---|---|---|
| 6,493,644 B1 * | 12/2002 | Jonker | G01R 21/133 |
| | | | 702/182 |
| 8,310,370 B1 | 11/2012 | Williams, Jr. et al. | |
| 2012/0029711 A1 | 2/2012 | Besore et al. | |
| 2012/0053739 A1 | 3/2012 | Brian et al. | |

(Continued)

FOREIGN PATENT DOCUMENTS

| | | |
|---|---|---|
| JP | 2014150405 A | 8/2014 |
| JP | 2016045052 A | 4/2016 |

(Continued)

*Primary Examiner* — Mischita L Henson
(74) *Attorney, Agent, or Firm* — IP Delta Plus Inc.

(57) ABSTRACT

The present specification relates to a power grid electric transient detector, a method of detecting a power grid electric transient, and an electric provisioning system detecting the power grid electric load. The power grid electric transient is estimated by receiving an electric parameter for electricity received from a power grid at a consuming facility. A digital filter extracts transient of the electric parameter. A processor analyzes the transients of the electric parameter and generates a power grid performance index based on the analyzed transient of the electric parameter.

17 Claims, 12 Drawing Sheets

(56) References Cited

U.S. PATENT DOCUMENTS

| | | |
|---|---|---|
| 2012/0053740 A1 | 3/2012 | Venkatakrishnan et al. |
| 2012/0053741 A1 | 3/2012 | Beyerle et al. |
| 2013/0013123 A1 | 1/2013 | Ozaki |
| 2014/0214229 A1 | 7/2014 | Burke et al. |
| 2015/0032666 A1 | 1/2015 | Togo |
| 2018/0012157 A1 | 1/2018 | Kikiras et al. |
| 2018/0075548 A1 | 3/2018 | Madonna et al. |

FOREIGN PATENT DOCUMENTS

| | | |
|---|---|---|
| JP | 2017055629 A | 3/2017 |
| KR | 20170055184 A | 5/2017 |
| WO | 2015046320 A1 | 4/2015 |

\* cited by examiner

POWER GRID ELECTRIC TRANSIENT DETECTOR, METHOD FOR DETECTING POWER GRID ELECTRIC TRANSIENTS AND ELECTRIC MANAGEMENT SYSTEM WITH POWER GRID ELECTRIC TRANSIENT DETECTION

TECHNICAL FIELD

The present disclosure relates to the field of energy management, and more particularly to a power grid electric transient detector, a method of detecting a power grid electric transient and an electric management system detecting a power grid electric transient.

BACKGROUND

Demand Side Management (DSM) programs aim at reducing overall energy consumption and/or diminish consumption of utility resources by utility consumers during peak periods. The adoption of DSM initiatives depends mainly on implementation costs and convenience, for both the utility provider and utility consumers.

Current DSM programs and DSM systems are based on predicting aggregated utility consumption (i.e. day-ahead or hours-ahead), scheduled utility network control, and/or utility broadcasting of consumption reduction incentives. These programs target local utility consumption so as to avoid or reduce stress caused by peak periods on the utility resource grid.

Typically, scheduled utility network control and utility consumption reduction incentives require communications between the utility provider and utility consumers. Such DSM programs and systems thus rely on utility network control signals exchanged between the utility resource grid and the utility resource consumers. To provide such exchanges, additional implementation costs are necessary, and the return on the investment for both the utility provider and utility consumers are not always important enough to ensure a broad adoption. Furthermore, such DSM programs eventually affect a comfort level of the utility resource consumer, adding to the resistance to adopt such programs.

There is therefore a need for a method and system for managing utility resources, which is more easily deployable and scalable, while proving interesting for both the utility provider and utility consumers.

SUMMARY

According to a first aspect, the present disclosure relates to a power grid electric transient detector comprising an input unit, a digital filter and a processor. The input unit receives an electric parameter of electricity received from a power grid at a consuming facility. The digital filter extracts transients of the electric parameter. The processor analyzes the transients of the electric parameter and generates a power grid performance index based on the analyzed transients of the electric parameter.

According to a second aspect, the present disclosure relates to a method for detecting a power grid electric transient. The method comprises receiving at an input unit an electric parameter for electricity received from an electric grid at a consuming facility. The method also comprises extracting by a digital filter, a transient of the electric parameter. The method further analyzes by a processor, the transient of the electric. The method generates by the processor, a power grid performance index based on the analyzed transient of the electric parameter.

According to a third aspect, the present disclosure relates to an electric management system for managing electric provisioning at a consuming facility. The electric management system comprises a measurement unit, a power grid electric transient detector and an electric provisioning unit. The measurement unit is connected to an electric supply of the consuming facility. The measurement unit measures at least one electric parameter of the electricity received by the consuming facility. The power grid electric transient detector comprises an input unit for receiving the at least one measured electric parameter from the measurement unit. The power grid electric transient detector further comprises a digital filter for extracting a transient of at least one of the electric parameters. The power grid electric transient detector also comprises a processor for analyzing the transient of the at least one of the electric parameters and generating a power grid performance index based on the analyzed transient of the at least one of the electric parameters. The electric provisioning unit comprises an input unit for receiving the power grid performance index. The electric provisioning unit also comprises a processor for analyzing the grid performance index and managing electric provisioning of the consuming facility based on the analyzed grid performance index.

BRIEF DESCRIPTION OF THE DRAWINGS

Embodiments of the disclosure will be described by way of example only with reference to the accompanying drawings, in which.

DETAILED DESCRIPTION

Figure 1:
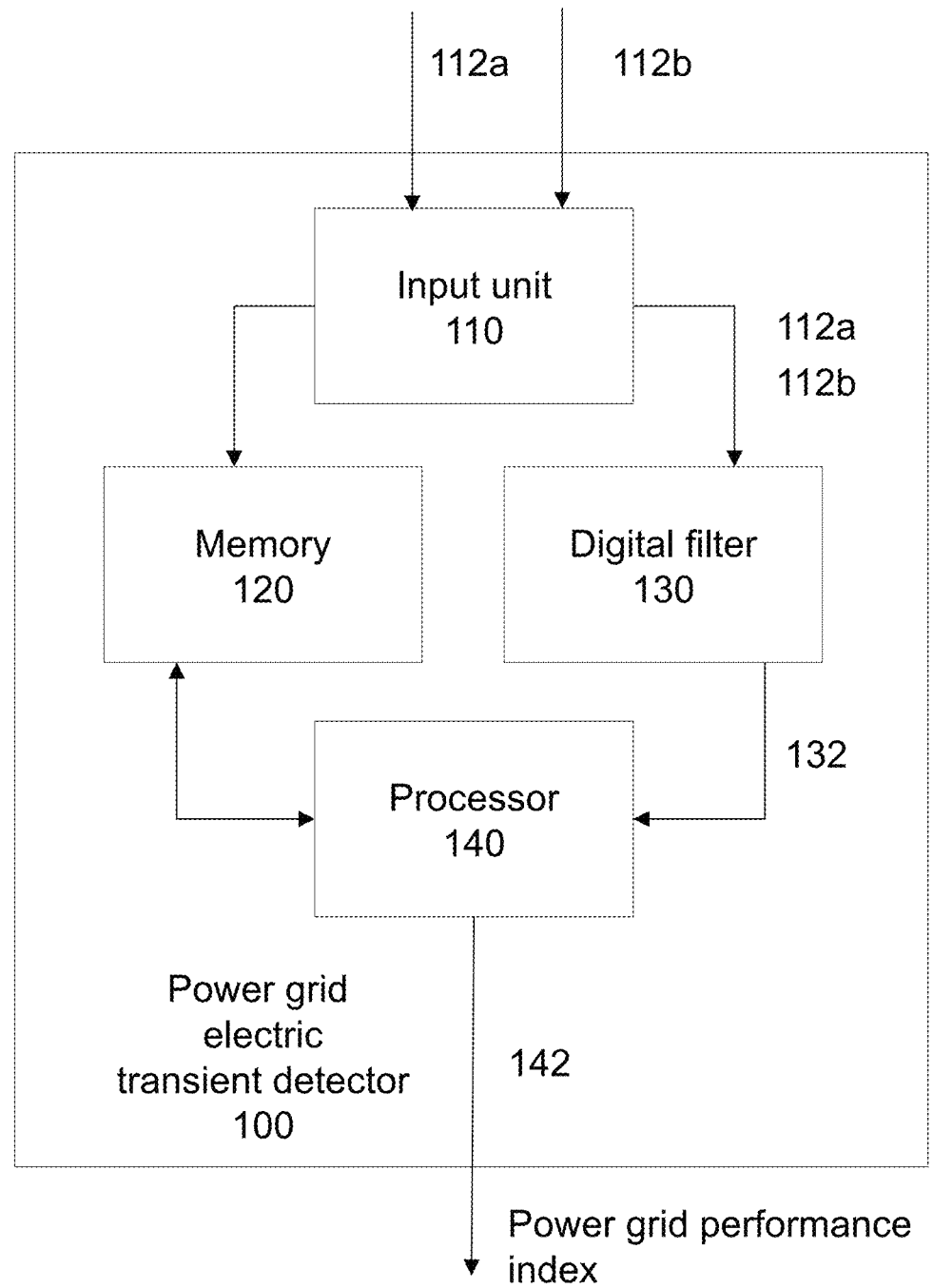
FIG. 1 is a schematic of a power grid electric transient detector.

The foregoing and other features will become more apparent upon reading of the following non-restrictive description of illustrative embodiments thereof, given by way of example only with reference to the accompanying drawings. Like numerals represent like features on the various drawings.

Various aspects of the present disclosure generally address the local estimation of a power grid electric transient, and more particularly a power grid electric transient detector, a method for detecting a power grid electric transient, and an electric management comprising such a power grid electric transient detector.

The following terminology is used throughout the present disclosure:

- Consuming facility: any type of electric consuming infrastructure, either connected directly or through one or several control panel(s), electric service entry(ies), such as for example a building (residential, commercial, industrial), or any other type of utility consuming device, such as for example an electric vehicle;
- Electric parameter: any electric value or other measurable factor that is directly or indirectly measured, or obtained from received or consumed electricity, such as for example: frequency of an Alternating Current (AC), instantaneous voltage, mean voltage, root mean square (RMS) voltage, main current, real power consumption, reactive power consumption, energy consumption, voltage harmonic content, current harmonic current, normalized local load impedance instantaneous value, normalized local load impedance mean value, etc.; and
- Power grid: any type of electric provider, either private, public, local, national, providing electricity to electric consumers.
- Power grid electric transient: temporary fluctuation of the value of any of the electric parameter of the electricity received or consumed by the consuming facility;
- Power grid performance index: any of a power grid peak period(s), a power grid off-peak period(s), a power grid estimated incentive message and a power grid estimated control message.

The present specification describes a power grid electric transient detector, which provides local estimation of the power grid electric transient from the consuming facility. The power grid electric transient detector relies on electric parameters that can be measured and/or extracted from the electricity received at the consuming facility and generates therefrom a power grid performance index. The present power grid electric transient detector thus overcomes the communications required between the electric provider managing the power grid and the consuming facility, as transients of the power grid to which the consuming facility is connected to are locally estimated from the behavior of the power grid at the consuming facility. The present specification also provides a method for locally detecting a power grid electric transient, and an electric management system which includes the present power grid electric transient detector.

Power grids provide electricity to many consuming facilities concurrently. As the electric needs of the various consuming facilities increase or reduce, the electricity provided by the power grid is affected by such variations. The effect on the power grid of the increase or reduction of each consuming facility is negligible, but the aggregated increase or reduction results in the presence of transients to one or several electric parameters of the electricity received at each consuming facility.

The present power grid electric transient detector, method and electric management system propose a new solution to the management of electricity at the consuming facilities by detecting the transients present in the one or several electric parameters of the electricity received or consumed. To detect and estimate the transients present in the one or several electric parameters, the present power grid electric transient detector receives measurements of the one or several electric parameters for the electricity received at the consuming facility. Thus, the present power grid electric transient detector, method and electric management system offer a completely scalable and quickly deployable solution, for obtaining a better grasp of the current status of the power grid, and local control of the electricity consumed based on the power grid transient detection obtained locally.

Power Grid Electric Transient Detector

Referring now to FIG. 1, there is depicted a schematic overview of a power grid electric transient detector 100. The power grid electric transient detector 100 comprises an input unit 110 for receiving one or several electric parameter(s) 112$a$ and 112$b$ for the electricity received at a consuming facility. Examples of any electric parameter(s) 112$a$ and 112$b$ include any electric value or other measurable factor that is directly or indirectly measured, which can be obtained from received or consumed electricity, such as for example: frequency of an Alternating Current (AC), instantaneous voltage, mean voltage, root mean square (RMS) voltage, main current, real power consumption, reactive power consumption, energy consumption, voltage harmonic content, current harmonic current, normalized local load impedance instantaneous value, normalized local load impedance mean value, etc. As electricity is an analog signal which continuously fluctuates, the input unit 110 receives the one or several electric parameter(s) for samples of electricity received at the consuming facility. The samples of electricity received at the consuming facility may be taken at different sampling rates, depending on the level of responsiveness desired. For power grids where the peak periods occur very rapidly, the sampling rates may be set to a shorter time period, while for power grids where the peak periods occur more gradually, the sampling rates may be set to a longer time period. For sake of convenience, the electric parameters 112$a$ and 112$b$ will alternately be referred to as the electric parameter 112 through the present specification.

The input unit 110 may continuously receive the one or several electric parameter(s) 112$a$ and 112$b$, or the input unit 110 may periodically or intermittently receive the one or several electric parameter(s) 112$a$ and 112$b$, for example depending on the hours of the day, day of the week, holidays, etc. The input unit 110 may receive several electric parameters 112$a$ and 112$b$ concurrently or sequentially for the electricity received at the consuming facility. For example, the input unit 110 may continuously receive one electric parameter 112$a$ and receive another electric parameter 112$b$ intermittently. Alternatively, the input unit 110 may continuously receive the various electric parameters 112$a$ and 112$b$ concurrently. Although only two electric parameters 112$a$ and 112$b$ are shown on FIG. 1, the present input unit 110 and power grid electric transient detector 100 is not limited to such a number of electric parameters, as any number of electric parameters may be used by the present power grid electric transient detector 100.

Although not specifically shown, the input unit 110 may further comprise an analog/digital converter, for receiving electric parameters 112$a$ and 112$b$ in an analog format and converting the analog electric parameters into digital electric parameters.

The input unit 110 provides the received electric parameters 112$a$ and 112$b$ to a memory 120 for storage. The memory 120 may store the received electric parameters 112$a$ and 112$b$ as a first-in first-out buffer or any other known storage method. The input unit 110 also provides the received one or several electric parameter(s) 112$a$ and 112$b$ to a digital filter 130. The digital filter 130 extracts transients 132 of each of the one or several of electric parameters 112$a$ and 112$b$. The extracted transients 132 of electric parameters 112$a$ and 112$b$ are provided to a processor 140. A description of how the digital filter 130 extracts transients from the one or several electric parameters 112$a$ and 112$b$ and examples thereof will be provided further.

The processor 140 may be implemented by a single processor, a plurality of processors, a Field Programmable Gate Array, or performed in the cloud (although not shown). The processor 140 receives the extracted transients 132 either directly from an electric connection to the digital filter 130, or wirelessly, and analyzes the transients 132 and the electric parameters 112a and 112b. The analysis of the transients 132 and the electric parameters 112a and 11b enables the processor to generate a power grid performance index, as described hereinafter.

Extracting Electric Transients

The digital filter 130 extracts the transients, present on the electricity received and/or consumed. The electric parameter, denoted $X(n)$ is convolved with the digital filter 130, denoted $\psi$ to obtain the transient(s) $\delta(k)$ according to equation (1).

$$\delta(n) = \sum_{k=-l}^{l} [\psi(k, a) \cdot X(n+k)] \quad (1)$$

where: $2l+1$ is a number of coefficients of the digital filter 130;

l is set to 30 (for the present example); and the electric parameter is sampled at a sample rate of $T_S=1$ s, for permitting an analysis within a window of approximately one minute.

The digital filter 130, u, can be defined for example using a Ricker wavelet $\psi_R$, mathematically represented in equation (2), or using other transversal filters, e.g. Morlet wavelet filter $\psi_M$ mathematically represented by equation (3) or a Gaussian filter GF mathematically represented by equation (4).

$$\psi_R(k, a) = \frac{2}{\sqrt{3a}\,\pi^{\frac{1}{4}}}\left[1 - \frac{k^2}{a^2}\right] e^{\frac{-k^2}{2a^2}} \quad (2)$$

Notice that a, in the formulation of Ricker wavelet $\psi_R$ of equation (2) corresponds to a first zero crossing of the wavelet function which also corresponds to a position of one standard deviation of the exponential term at right of equation (2).

$$\psi_M(k, a, b, \beta) = e^{-\frac{\beta^2(k-b)^2}{a^2}} \cos\left[\frac{\pi(k-b)}{a}\right] \quad (3)$$

In the formulation of the Morlet wavelet filter $\psi_M$ represented mathematically by equation (3), a and b are respectively the dilation and translation coefficients, and the term β is used to control the shape of the wavelet.

$$GF(k, a) = e^{\frac{-k^2}{2a^2}} \quad (4)$$

If the Gaussian filter mathematically represented by equation (4) is employed, the transient information can be computed using equation (5), which reads as follows:

$$\delta(n+2a) = X(n+2a) - \sum_{k=-l}^{l} [GF(k, a) \cdot X(n+k)] \quad (5)$$

Figure 2:
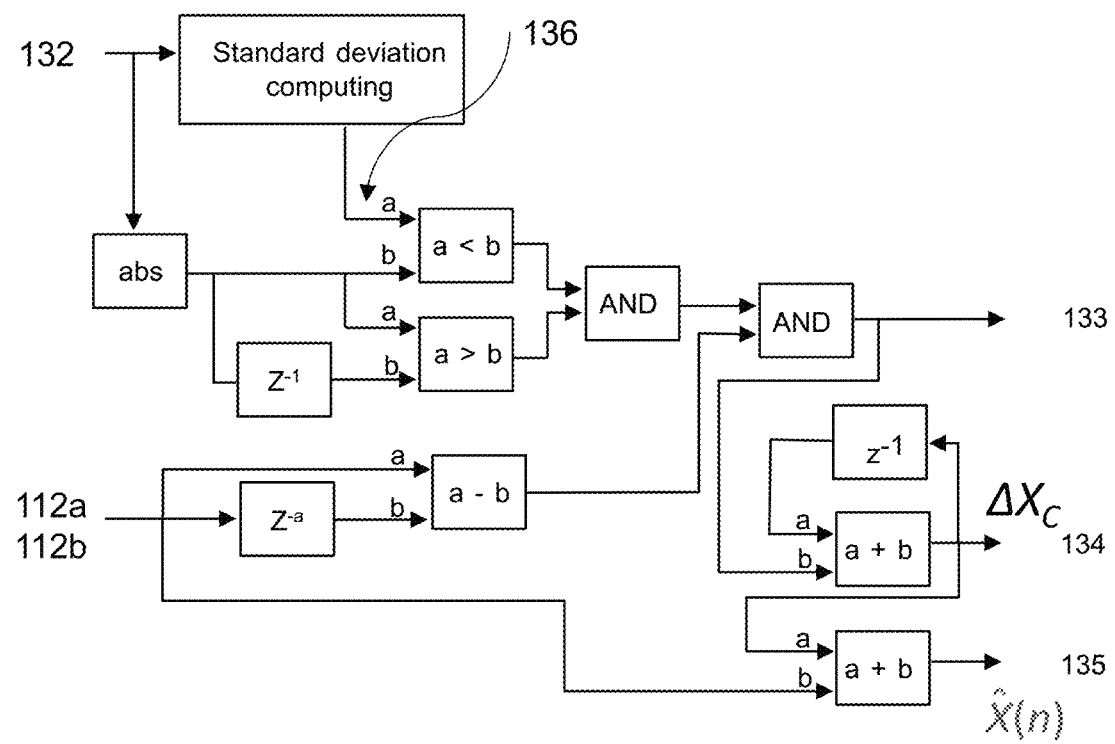
FIG. 2 is a simplified logical diagram of an example of the present power grid electric transient detector.
Figure 3:
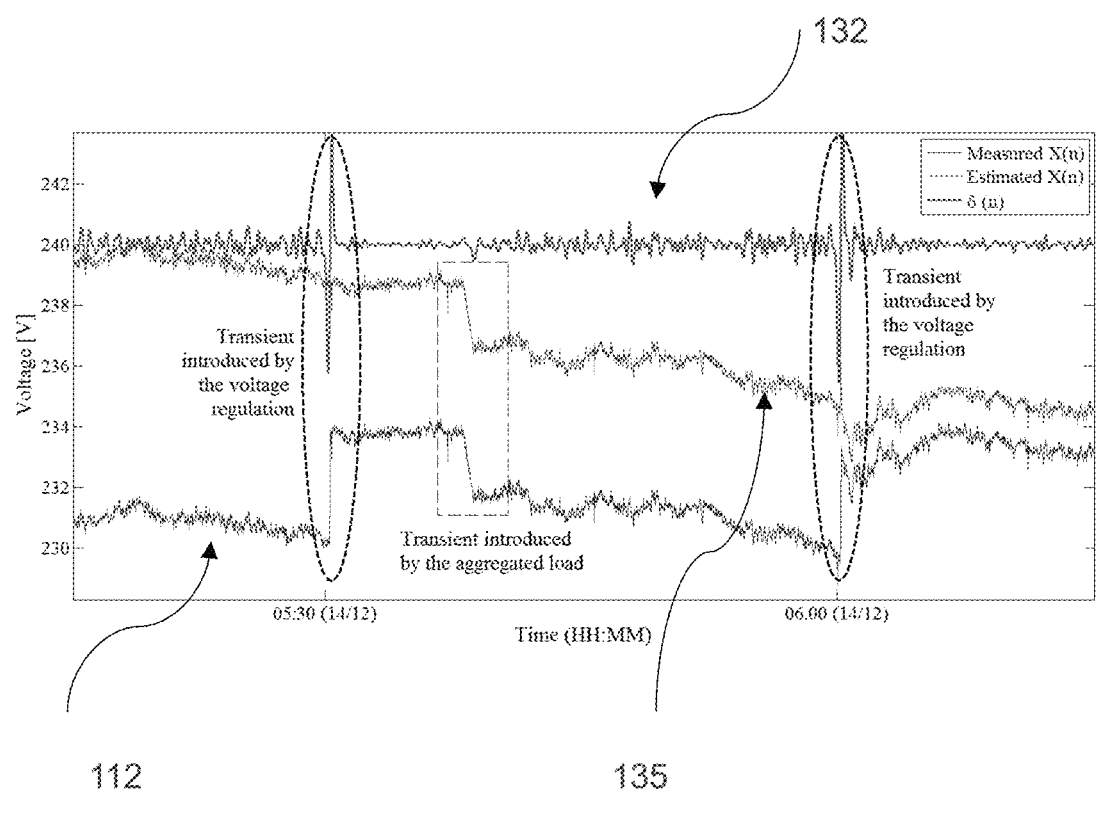
FIG. 3 is an exemplary graph of power grid electric transient detection.

Reference is now made concurrently to FIGS. 1-3, where FIG. 2 is a simplified logical diagram of an exemplary implementation of the present power grid electric transient detector, wherein the processor 140 is further adapted for estimating voltage steps 133 and an accumulated voltage compensation 134, while FIG. 3 is an exemplary graph of a power grid electric transient detection. More particularly, in the example shown on FIG. 2, the present digital filter detects transients in the RMS voltage received and the processor 140 estimates therefore the voltage steps 133 and an accumulated voltage compensation 134.

The processor 140 uses the detected transients 132 and the electric parameter, which in the present example is the measured RMS voltage 112a, to determine the estimated voltage step 133 (up or down), denoted $\Delta X$, introduced by the regulation system of the power grid (e.g. LTCs). The detection procedure is based on the comparison of the instantaneous value of transient information 132, $\delta$, to a detection threshold 136, denoted $\delta_{TH}$, defined in terms of the standard deviation ($\sigma$) of historic transient information 132.

Considering common continuous probability distribution, the information within $-3\sigma$ and $+3\sigma$ of the voltage transients is determined to cover 99.7% of the normal distribution which corresponds to the typical variations and noise of the measured electric parameter for the present example. Therefore, for the sake of the present example, the transients higher than $3\sigma$ will be detected, but such a range is determined on a per electrical parameter and per power grid specification basis and should not be construed as a predefined range to be respected. Taking that feature into account, sudden and high transients are identified considering a $\delta_{TH}$ setting higher than $3\sigma$.

As illustrated in FIG. 2, the estimated accumulated voltage compensation 134, denoted $\Delta X_C$, is obtained from its previous value and the estimated voltage step 133.

From the utility RMS voltage 112 (also denoted X) and the estimated accumulated voltage compensation 134 ($\Delta X_C$) it is possible for the processor 140 to obtain the estimated uncompensated voltage 135 $\hat{X}(n)$ using the equation (6).

$$\hat{X}(n) = X(n) + \Delta X_C(n) \quad (6)$$

Power Grid Performance Index

The relative power profile of the power grid at the instant n, $\hat{P}_{A,v}(n)$, can be calculated by the processor 140 from the measurement 112 (X) and the estimated voltage ($\Delta X$) 133 (or directly from the estimated accumulated voltage compensation 134 ($\Delta X_C$)) according to equation (7).

$$\hat{P}_{A,v}(n) = \frac{X(m) - \left(X(n) + \sum_{i=m+1}^{n}[\Delta X(i)]\right)}{X(m) + \sum_{i=1}^{m}[\Delta X(i)]} \quad (7)$$

$$= \frac{X(m) + \Delta X_C(m) - (X(n) + \Delta X_C(n))}{X(m) + \Delta X_C(m)}$$

The estimated $\hat{P}_{A,v}(n)$, defined by equation (7), can be computed by the processor 140 with regard to a specific instant m, the default setting applied being m=1 in order to define an analysis with reference to the first data of measurement window. However, for convenience according to the desired period of analysis, m can be set to correspond to any different instant within the recorded dataset.

The estimated relative power $\hat{P}_{A,v}(n)$ is calculated by the processor 140, and is an example of the power grid performance index 142, providing the information of peak and off-peak periods to be used by a management system, discussed further, to generate a curtailment or a modulation signal.

An example of the detection of transient information 132 and the estimated uncompensated voltage 135 is presented in FIG. 3. In this graph, corresponding to an early morning period, two transient events are correctly detected by the power grid electric transient detector 100 based on analysis of the electric parameter corresponding to the voltage.

Figure 4A:
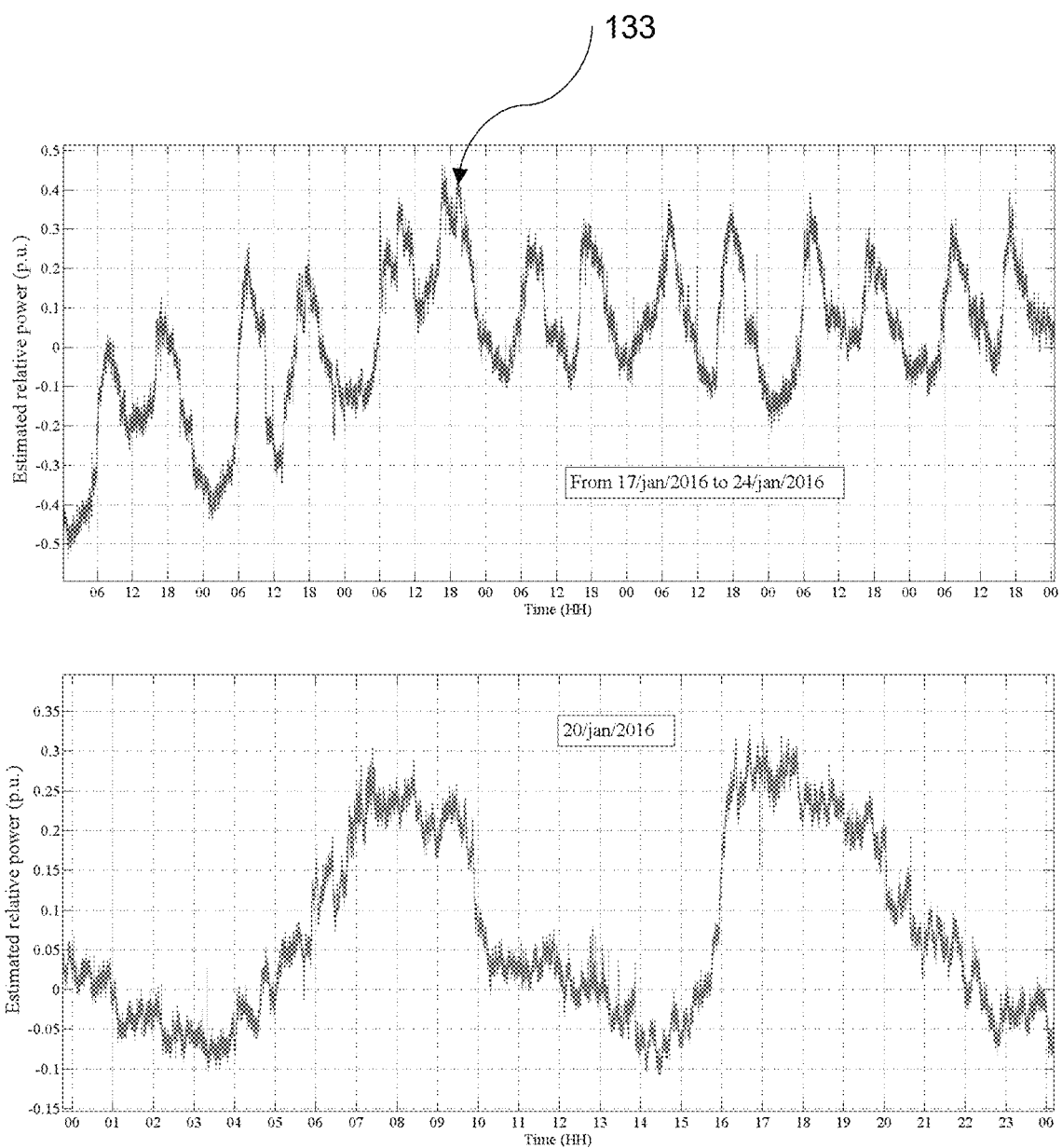
FIG. 4A is a graph depicting an example of the estimated relative power 133, for a period of one week and for one day in January 2016.

An example of the estimated relative power 133, for a period of one week and for one day in January 2016, is presented in FIG. 4A. In the one-day plot of example, it is observed that, the estimated relative power 133 starts rising in the morning near to 5 a.m. and in the afternoon near to 4 p.m.; clearly defining two peak periods (or high consumption periods) with respect to the valley periods near to 3 a.m. and 2 p.m.

Figure 4B:
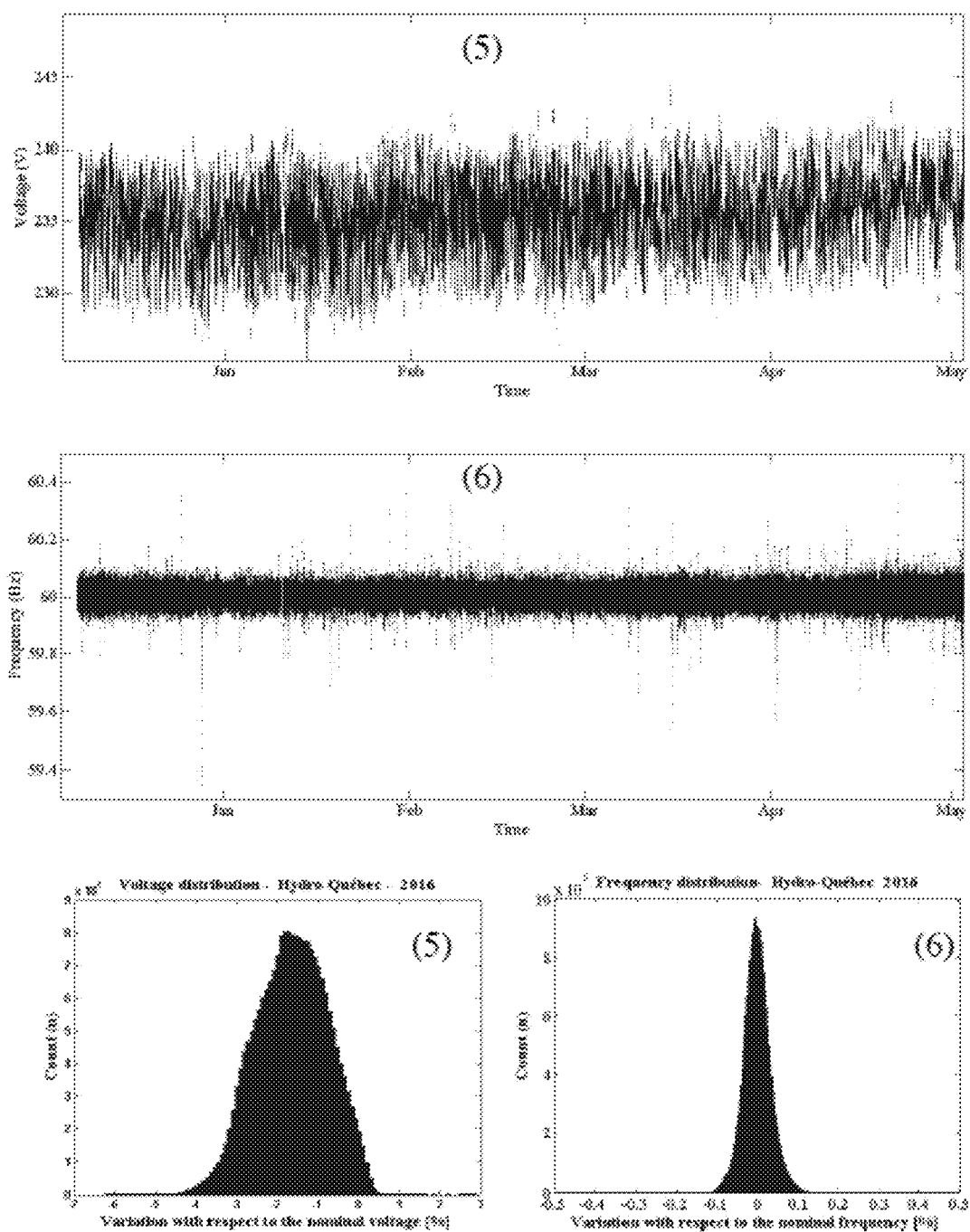
FIG. 4B is an example of measurements of voltage and frequency.

Reference is now further made to FIG. 4B, alternatively or complementary to the previously discussed, if a frequency/power droop is implemented by the power grid and the droop coefficient m (in Hertz/Watt) and the reference power $P_0$ (in Watt) information is sent by the power grid to consuming facility, the aggregated power profile depending on the frequency $\hat{P}_{A,f}(n)$ seen by the power grid, can be locally estimated by the processor 140 from the nominal frequency and estimated mean frequency $f_0$ and $\hat{f}$ 131 respectively using $$\hat{P}_{A,f}(n) = P_0 + \frac{f_0 - \hat{f}(n)}{m} \quad (8)$$

This signal $\hat{P}_{A,f}(n)$, can be used as the power grid performance index 142, in the form of an incentive or control signal for energy management purposes. Notice that mean frequency 131 ($\hat{f}$) is obtained from the measured frequency 106 by means of the Gaussian digital filter 130.

Figure 5:
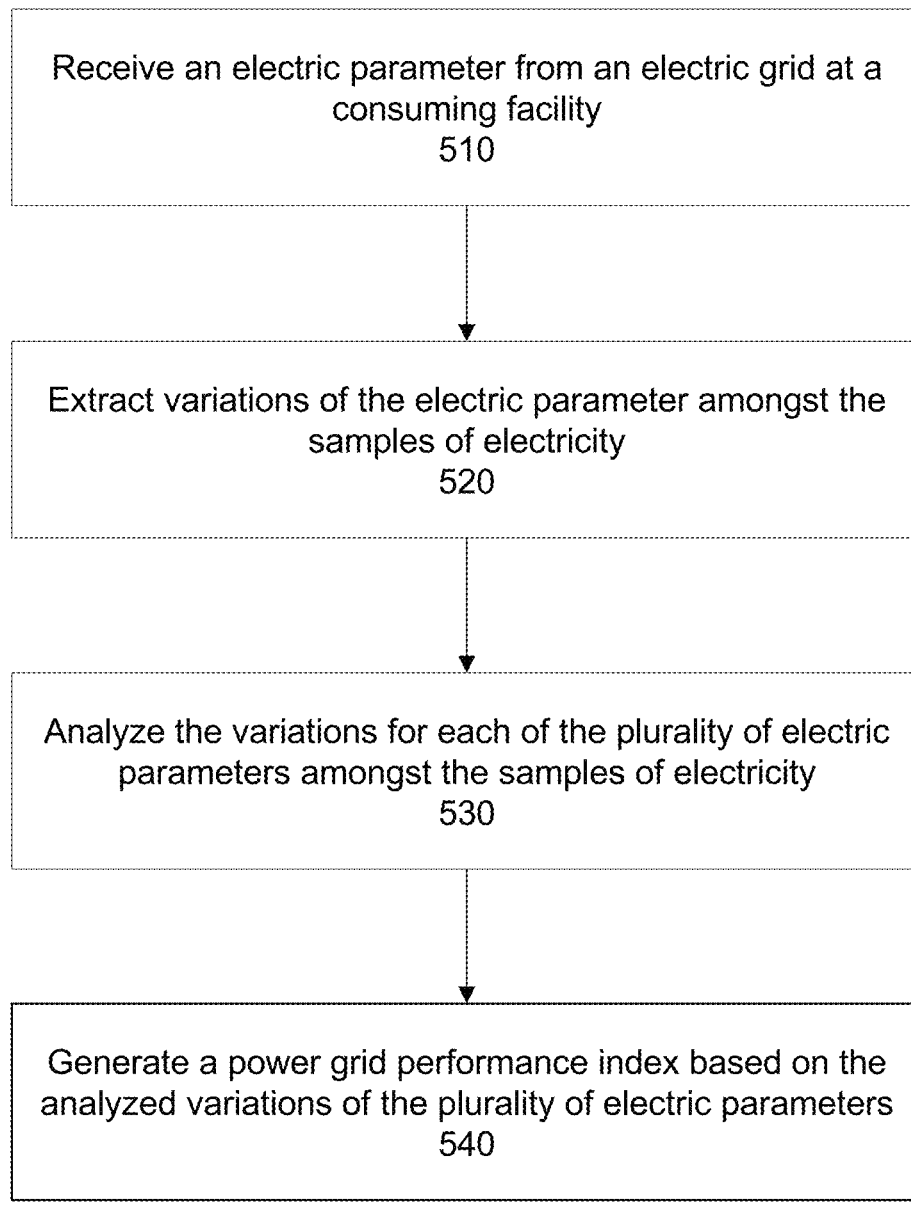
FIG. 5 is a flow diagram of a method for detecting power grid electric transient.

Reference is now made concurrently to FIG. 1, where FIG. 5 is a flow diagram of a method 500 for detecting power grid electric transient. The method 500 starts with receiving 510 at an input unit 110 one or several electric parameter(s) 112 of electricity received from an electric grid at a consuming facility. The received electric parameter(s) is measured over time, at a sample rate T. The method 500 continues by extracting 520 by a digital filter 120, transients of the electric parameter, as previously described. The method 500 then analyzes 530, by the processor 140, the transients of the electric parameter and generates 540, the power grid performance index 142 based on the analyzed transients of the electric parameter.

Figure 6A:
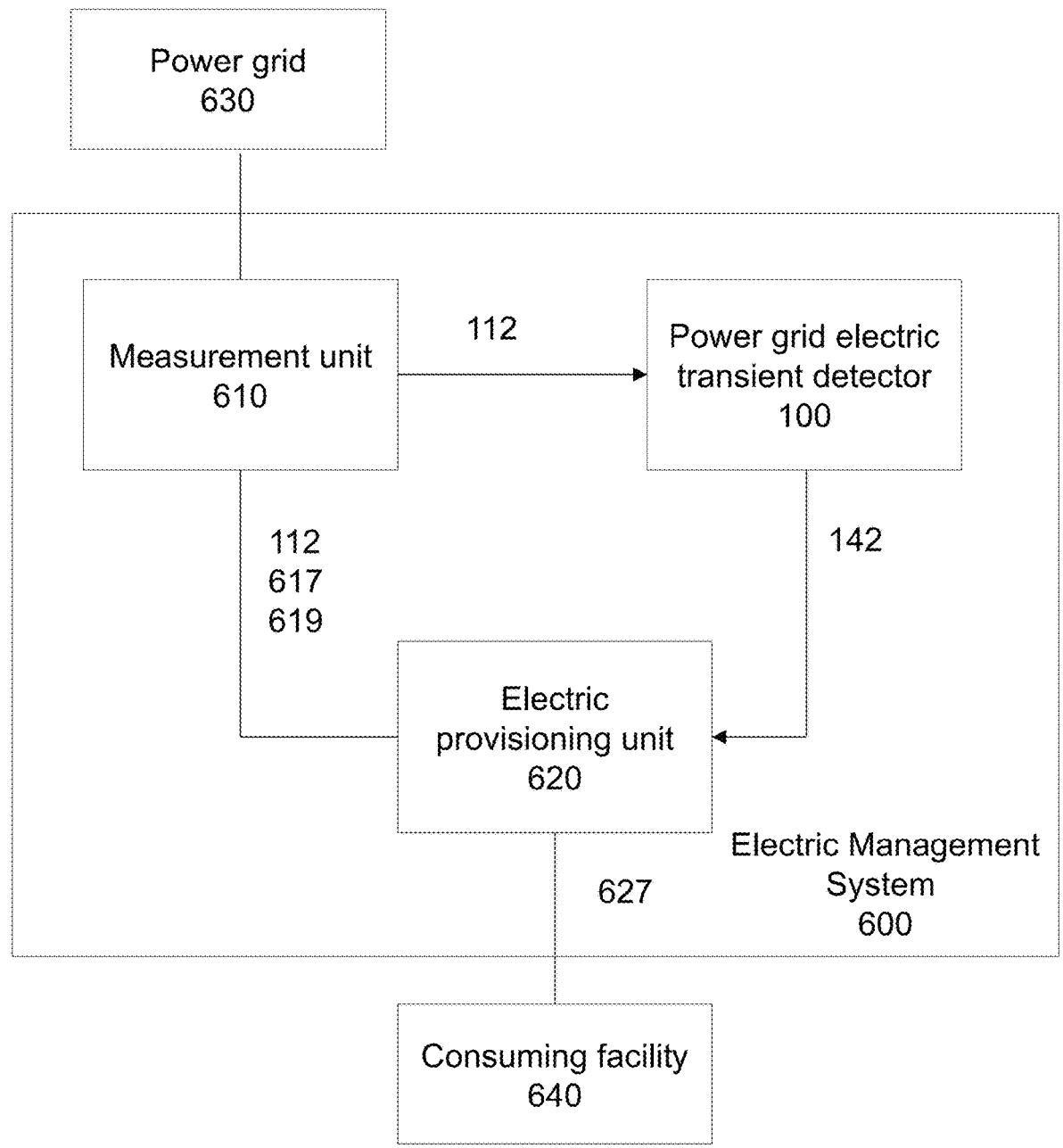
FIGS. 6A-6D are exemplary schematic of electric managements with power grid electric transition detection.
Figure 6B:
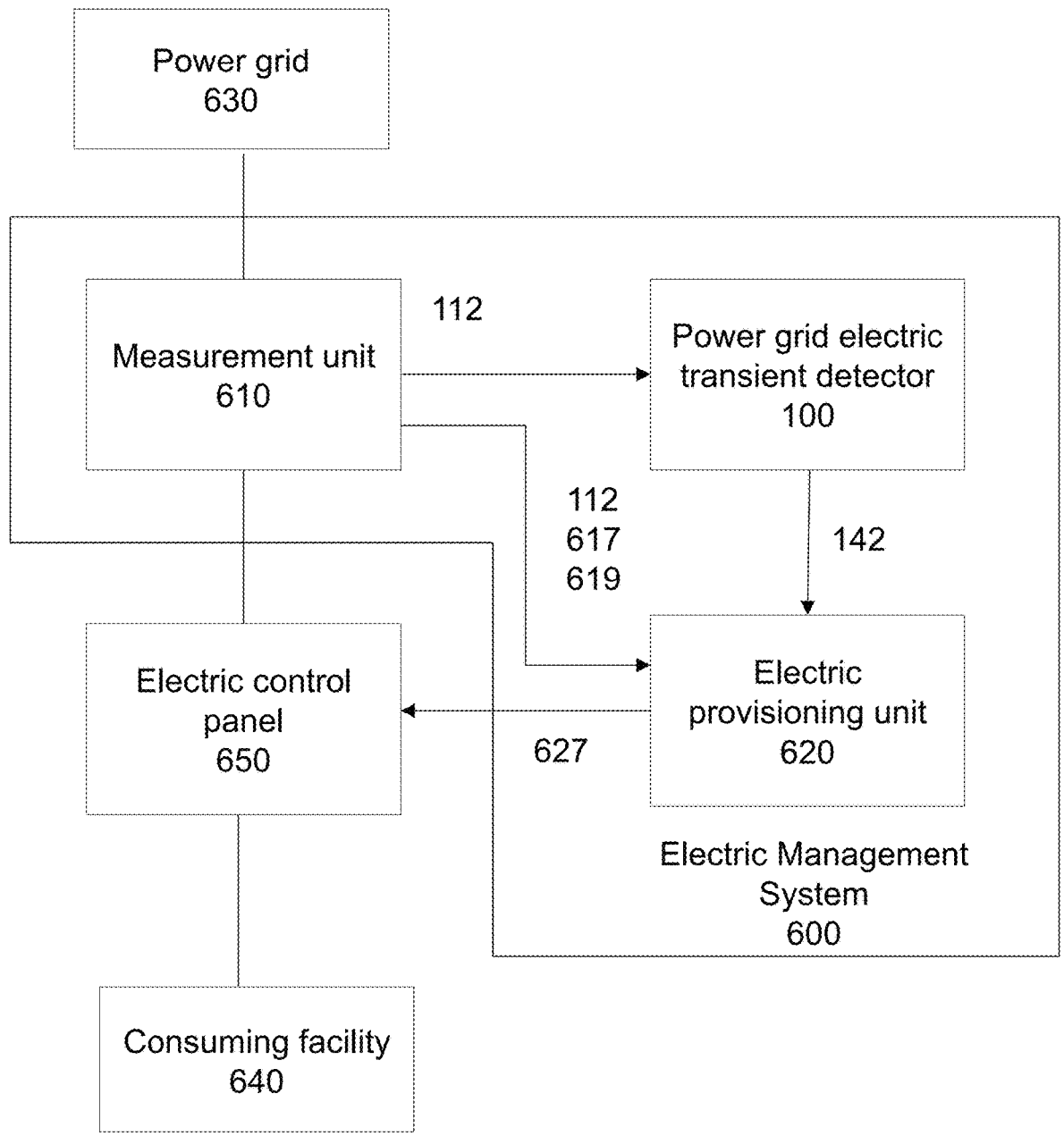
Figure 6C:
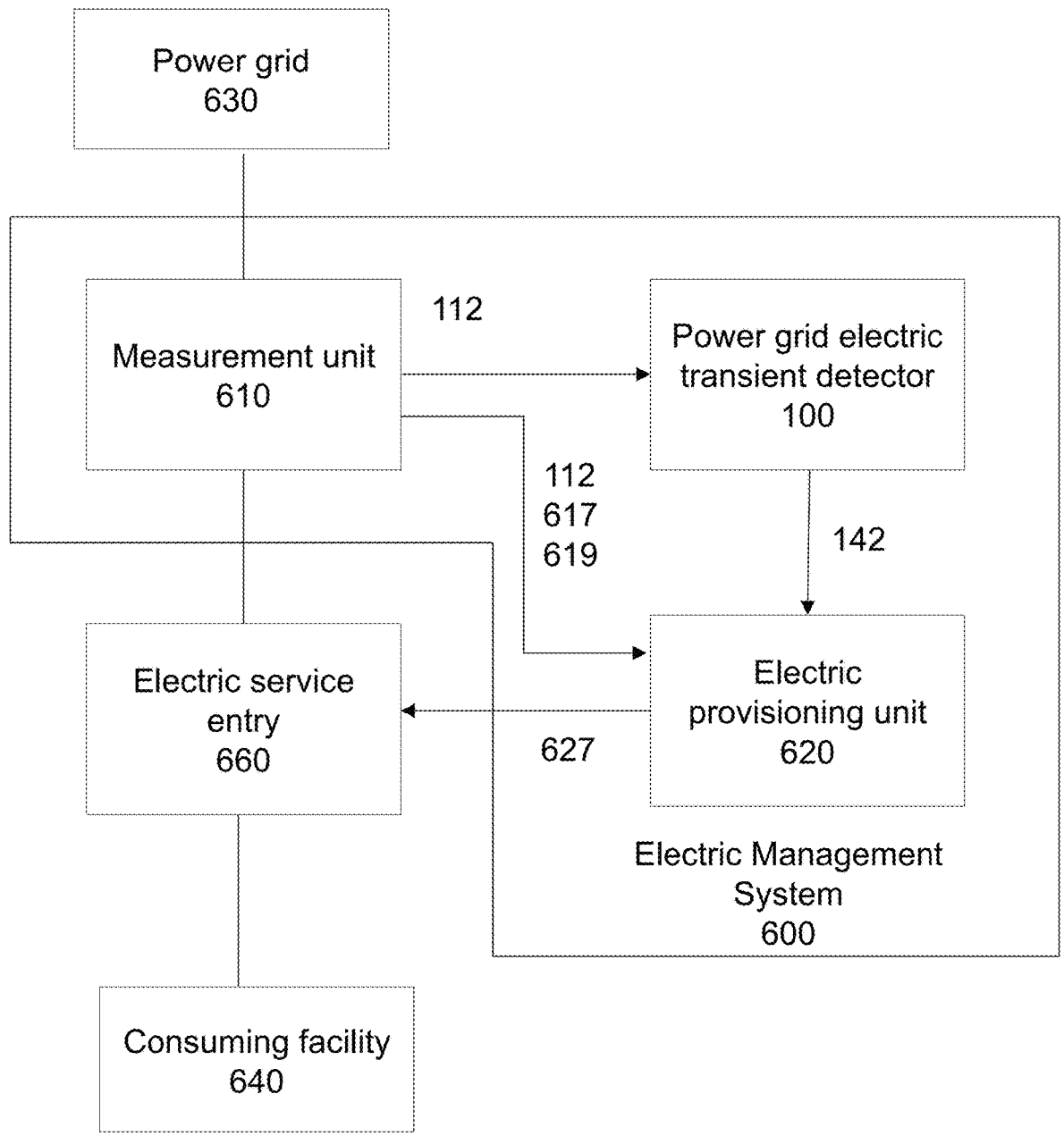
Figure 6D:
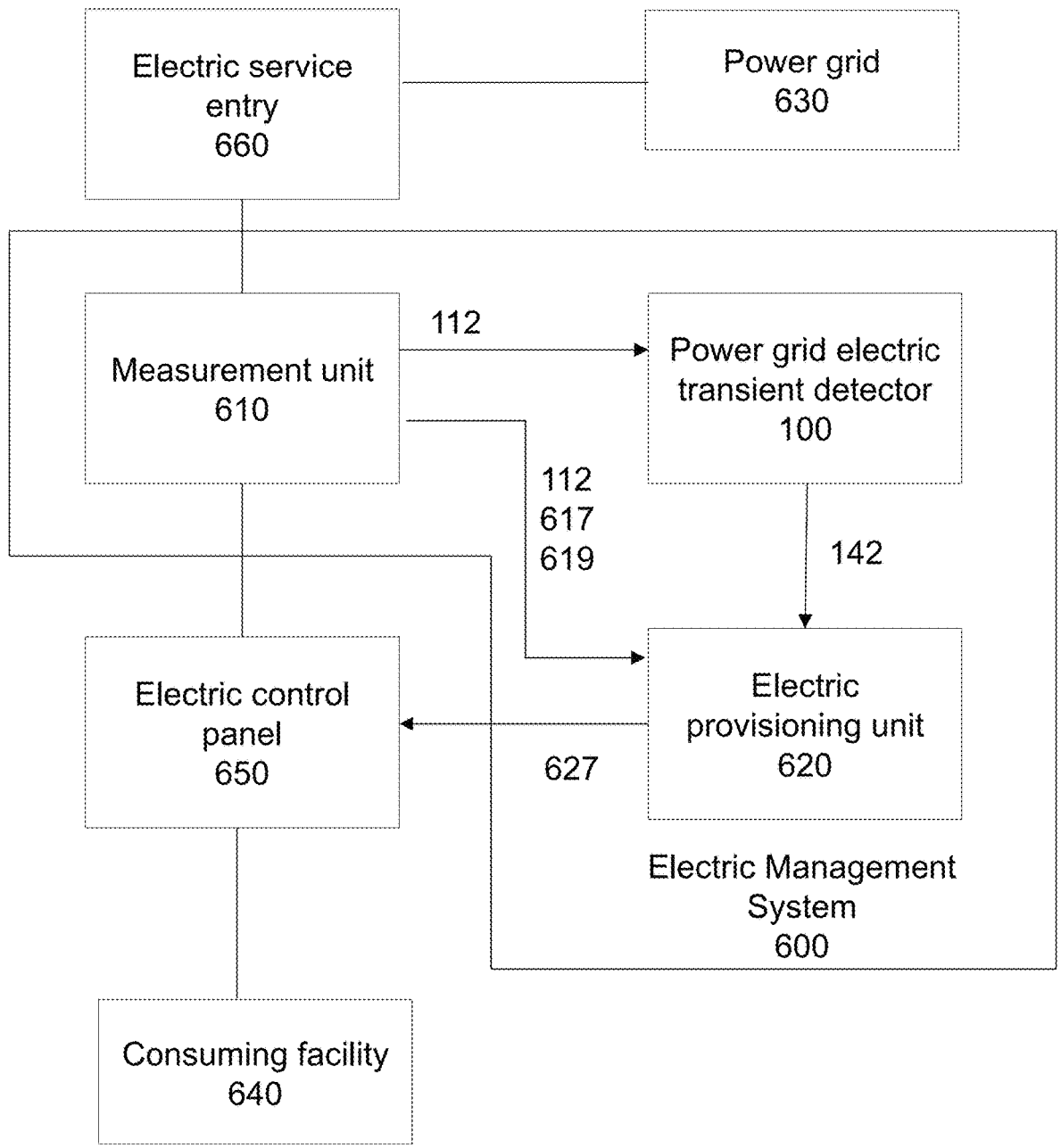

Reference is now made to FIGS. 6A-6D, which are exemplary schematics of an electric management system 600. The electric management system 600 comprises a measurement unit 610, the power grid electric transient detector 100 and an electric provisioning unit 620. The implementation of electric management system 600 shown on FIG. 6A is connected directly between the power grid 630, and the consuming facility 640. The implementation of electric management system 600 shown on FIG. 6B depicts another exemplary installation of the present electric management system 600, in which the measurement unit 610 is installed between the power grid 630 and an electric control panel 650, and the electric provisioning unit 620 controls the operation of the electric control panel 650. The implementation of electric management system 600 shown on FIG. 6C depicts another exemplary installation of the present electric management system 600, in which the measurement unit 610 is installed between the power grid 630 and an electric service entry 660, and the electric provisioning unit 620 controls the operation of the electric service entry 660. The implementation of electric management system 600 shown on FIG. 6D depicts another exemplary installation of the present electric management system 600, in which the measurement unit 610 is installed between the electric service entry 660 and an electric control panel 650, and the electric provisioning unit 620 controls the operation of the electric control panel 650.

Figure 7:
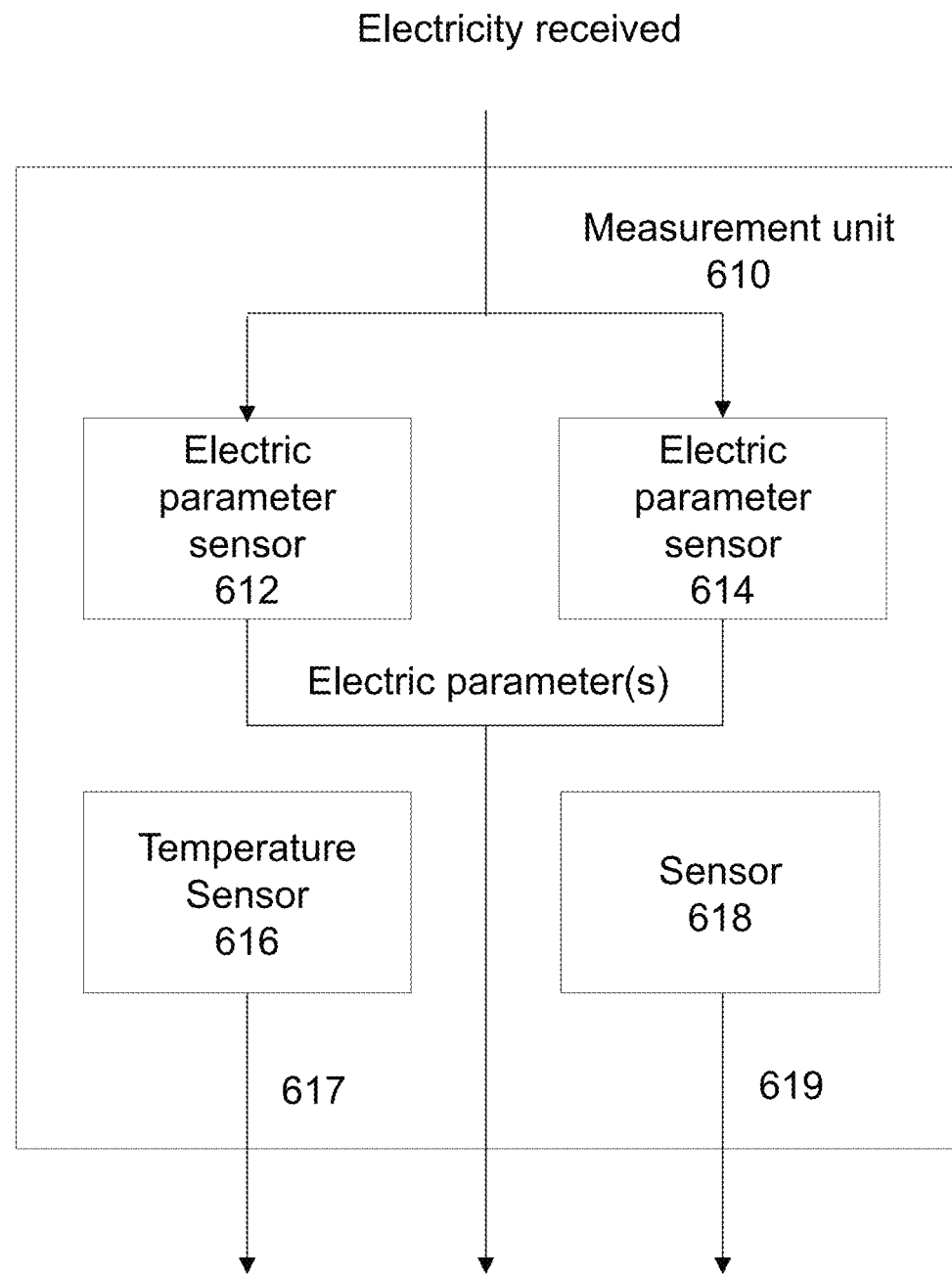
FIG. 7 is a schematic of an exemplary measurement unit 610.

Reference is now made concurrently to FIGS. 6A-6D and FIG. 7, which depicts an exemplary schematic of the measurement unit 610. The electric management system 600 relies on detection of power grid electric transients in the electricity received/consumed by the consuming facility 640. To efficiently detect the power grid electric transients, measurements of the electricity received is required. The measurement unit 610 obtains the required measurements. The measurement unit 610 depicted in FIG. 7 shows only examples of minimal components required to perform the required measurements. Therefore, the measurement unit 610 could thus include many different types of sensors 612-614, and multiple sensors of each type. For example, for measuring the electric parameters of the electricity received, the measurement unit 610 could comprise an Alternating Current (AC) frequency sensor, an instantaneous voltage sensor, a mean voltage sensor, a root mean square (RMS) voltage sensor, a main current sensor, a real power consumption sensor, a reactive power consumption sensor, an energy consumption sensor, a voltage harmonic content sensor, a harmonic current content sensor, a normalized local load impedance instantaneous value sensor, a normalized local load impedance mean value sensor, etc. Some of those types of sensors could be combined so as to provide multiple measurements through one sensor or kept separately. The combination of sensors provided in the measurement unit 610 is adapted to the type of consuming facility 640 in which the electric management system 600 is to be installed. In addition to the sensors for measuring the electric parameter(s), the measuring unit 610 may further comprise one or several temperature sensors 616, either located directly in the measurement unit 610 as shown on FIG. 7, or remotely positioned within or around the consuming facility 640 and in electronic communication (wired or wirelessly) with the measurement unit 610. The measurement unit 610 may further comprise one or several other types of sensors 618, for measuring other parameters having an effect on the electric consumption of the consuming facility 640. For example, the measurement unit 610 could comprise a sensor for humidity, a sensor for light level, a sensor for sunlight level, etc. Finally, the measurement unit 610 may include an analog digital converter (not shown) for converting analog measurements obtain from any of the sensors 612-618 into digital format. The sensors 612-618 of the measurement unit 610 may perform continuous measurements, periodic measurements, intermittent measurements, or punctual measurements. However, to ensure quality of the electric parameters measured, and because power grid electric transients are of short duration, continuous or high rate period measurements are usually preferred.

The measurement unit 610 is connected to the electric supply of the consuming facility. Examples of configurations of connection of the measurement unit 610 to the electric supply of the consuming facility 640 are depicted in FIGS. 6A-6D. In FIG. 6A, the measurement unit 610 is connected directly to the power grid 630. In FIG. 6B, the measurement unit 610 is connected between the power grid 630 and the electric control panel 650. In FIG. 6C, the measurement unit 610 is connected between the power grid 630 and the electric service entry 660. In FIG. 6D, the measurement unit 610 is connected between the electric service entry 660 and the electric control panel 650. Although shown as a separate entity from the electric service entry 660 and the electric control panel 650, the electric parameter sensors 612 and 614 of the measurement unit 610 could alternately be included in the electric service entry 660 and/or the electric control panel 650.

Figure 8:
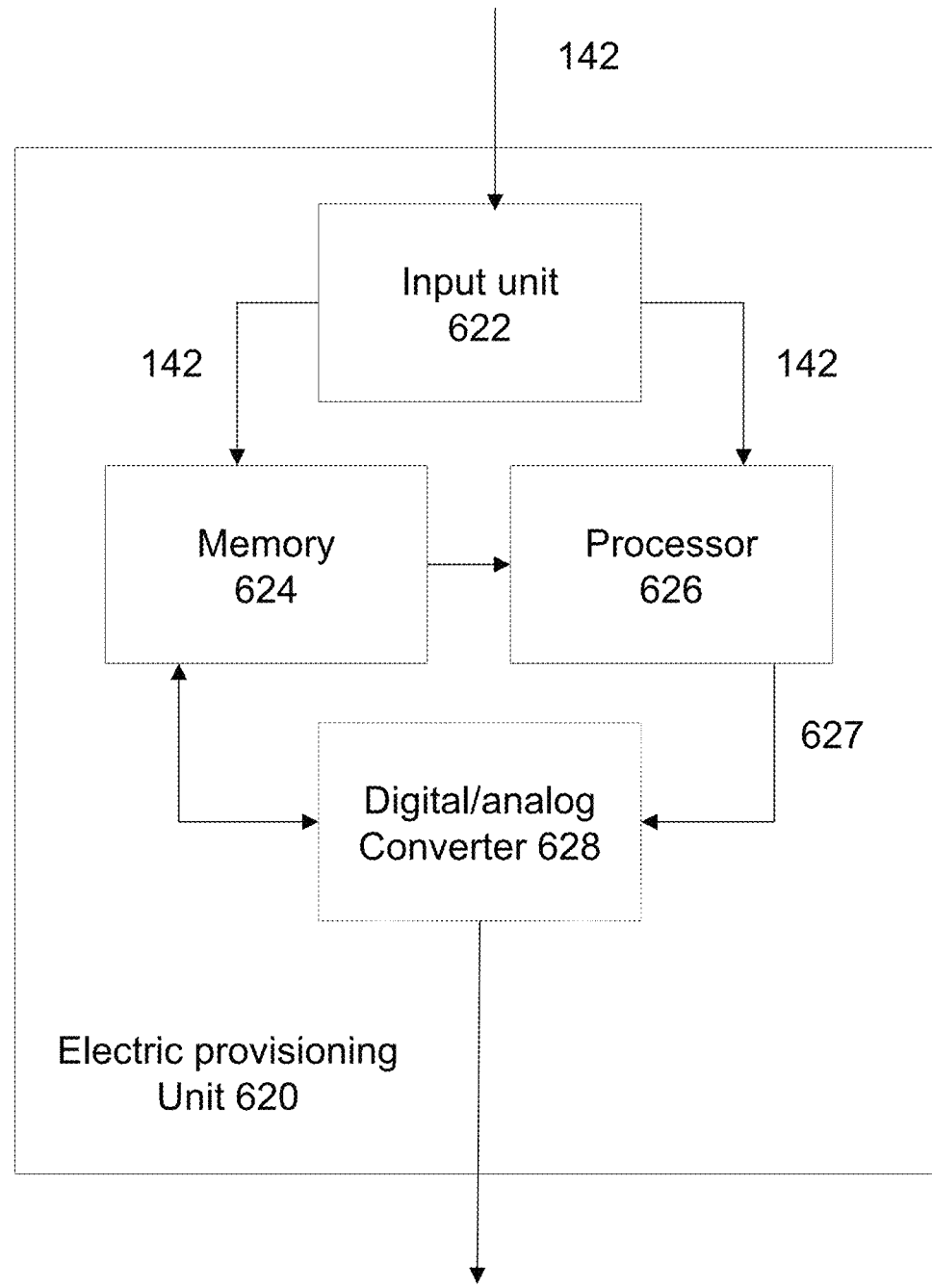
FIG. 8 is a schematic of an exemplary electric provisioning unit 620.

The electric parameters 112a and 112b measured by the electric parameter sensors 612 and 614 are provided to the power grid electric transient detector 100 for detecting the power grid electric transients therein, as previously described. The electric provisioning unit 620, in FIG. 8, comprises an input unit 622 for receiving from the power grid electric transient detector 100 the power grid performance index 142. Additionally, the input unit 622 of the electric provisioning unit 620 may further receive from the measurement unit 610, some or all the measurements made by the various sensors 612-618 of the measurement unit 610. The input unit 622 of the electric provisioning unit 620 further comprises a memory 624 for storing or buffering the measurements received from the input unit 622. The memory 624 may further store parameters and instructions used by a processor 626 for analyzing the power grid performance index 142 the other measurements 112, 617 and 619. The processor 626 of the electric provisioning unit 620 manages the electric provisioning of the consuming facility 640 based on the analyzed power grid performance index 142. The processor 626 of the electric provisioning unit 620 may further take into consideration the other measurements received, i.e. measurements 112, 617 and 619, when analyzing the power grid performance index 142, so as to manage the electric provisioning of the consuming facility 640 using a more global approach. The processor 626 generates a control message 627 which is either directly communicated to the consuming facility 640 as shown on FIG. 6A, to the electric control panel 650 as shown on FIGS. 6B and 6D or to the electric service entry 660 as shown on FIG. 6C. The control message 627 is provided in format that is recognizable by the recipient, so as to modify the electric provisioning of the consuming facility 640 in accordance with the control message 627. For example, the control message 627 may instruct the consuming facility 640 to reduce to a certain power the electricity provided to non-critical electrical loads in the consuming facility 640, while maintaining the electric power provided to critical electrical loads. Thus, the control message 627 may include one or several instructions indicating the electric parameters to be applied to one or several electric loads in a consuming facility 640, or simply provide the electric parameters to be applied by the consuming facility 640.

As previously discussed, the power grid performance index 142 may consist on any of the following: a power grid estimated voltage, a power grid estimated frequency, a power grid estimated incentive message and a power grid estimated control message. Thus, the present power grid electric transient detector 100 thus allows the present electric management unit 600 to manage the provisioning of electricity to the consuming facility 640, while taking into consideration the state of the power grid. The present electric management system 600 further allows management of the provisioning of electricity to the consuming facility 640 while taking concurrently into consideration the status of the power grid 630, but also the particular environmental conditions (exterior temperature, interior temperature, humidity level, lighting, solar lighting, etc.) of the consuming facility 640.

Thus, the present power grid electric transient detector 100, method 500 and electric management system 600 provide an efficient solution, which is easily deployable and scalable, for managing utility resources, while proving interesting for both the utility provider and utility consumers.

Although the present disclosure has been described hereinabove by way of non-restrictive, illustrative embodiments thereof, these embodiments may be modified at will within the scope of the appended claims without departing from the spirit and nature of the present disclosure.

What is claimed is:

1. A power grid electric transient detector comprising:
   an input for receiving an electric parameter for electricity received from a power grid at a consuming facility;
   a digital filter for extracting transients of the electric parameter of the electricity received;
   a processor for analyzing the transients of the electric parameter and generating a power grid performance index based on the analyzed transients of the electric parameter, the power grid performance index consisting of one of the following: a power grid estimated incentive message and a power grid estimated control message.

2. The power grid electric transient detector of claim 1, wherein the electric parameter for the electricity received at the consuming facility is one of the following:
   frequency, instantaneous voltage, mean voltage, root mean square voltage, main current, real power consumption, reactive power consumption, energy consumption, voltage harmonic content, current harmonic content, normalized local load impedance instantaneous value and normalized local load impedance mean value.

3. The power grid electric transient detector of claim 2, wherein:
   the electric parameter is the root mean square (RMS) voltage; and
   the digital filter extracts transients of the RMS voltage.

4. The power grid electric transient detector of claim 3, wherein:
   the digital filter extracts transient events from the transients of the RMS voltage.

5. The power grid electric transient detector of claim 1, wherein:
   the input receives a plurality of electric parameters for the electricity received from the electric grid at the consuming facility;
   the digital filter extracts transients for each of the plurality of electric parameters; and
   the processor analyzes the transients for each of the plurality of electric parameters and generates the power grid performance index based on the analyzed transients of the plurality of electric parameters.

6. A method for detecting a power grid electric transient, the method comprising:

receiving at an input an electric parameter for electricity received from an electric grid at a consuming facility;

extracting, by a digital filter, transients of the electric parameter;

analyzing, by a processor, the transients of the electric parameter; and generating, by the processor, a power grid performance index based on the analyzed transients of the electric parameter, the power grid performance index consisting of one of the following: a power grid estimated incentive message and a power grid estimated control message.

7. The method for detecting the power grid electric transient of claim 6, wherein:

the electric parameter for the electricity received at the consuming facility is one of the following: frequency, instantaneous voltage, mean voltage, root mean square voltage, main current, real power consumption, reactive power consumption, energy consumption, voltage harmonic content, current harmonic content, normalized local load impedance instantaneous value and normalized local load impedance mean value.

8. The method for detecting the power grid electric transient of claim 7, wherein:

the electric parameter is the root mean square (RMS) voltage; and the digital filter extracts transients of the RMS voltage.

9. The method for detecting the power grid electric transient of claim 8, wherein:

the digital filter extracts transient events from the transients of the RMS voltage.

10. The method for detecting the power grid electric transient of claim 6, wherein:

a plurality of electric parameters for electricity received from the electric grid at the consuming facility are received by the input;

transients for each of the plurality of electric parameters are extracted by the digital filter; and transients for each of the plurality of electric parameters are analyzed by the processor; and the power grid performance index is generated by the processor based on the analyzed transients of the plurality of electric parameters.

11. An electric management system for managing electric provisioning at a consuming facility, the electric management system comprising:

a measurement unit, the measurement unit being connected to an electric supply of the consuming facility, the measurement unit measuring at least one electric parameter of the electricity received by the consuming facility;

a power grid electric transient detector, the power grid electric detector comprising:

an input unit for receiving the at least one measured electric parameter from the measurement unit;

a digital filter for extracting transients of at least one of the electric parameters; and a processor for analyzing the transients of the at least one of the electric parameters and generating a power grid performance index based on the analyzed transients of the at least one of the electric parameters, the power grid performance index consisting of one of the following: a power grid estimated incentive message and a power grid estimated control message; and an electric provisioning unit comprising:

an input unit for receiving the power grid performance index;

a processor for analyzing the power grid performance index and managing electric provisioning of the consuming facility based on the analyzed power grid performance index.

12. The electric management system of claim 11, wherein the at least one electric parameter for the electricity received at the consuming facility is one of the following: frequency, instantaneous voltage, mean voltage, root mean square (RMS) voltage, main current, real power consumption, reactive power consumption, energy consumption, voltage harmonic content, current harmonic content, normalized local load impedance instantaneous value and normalized local load impedance mean value.

13. The electric management system of claim 12, wherein the power grid estimated index further comprises at least one of the following: a power grid estimated voltage and a power grid estimated frequency.

14. The electric management system of claim 11, wherein:

one of the electric parameters is the root mean square (RMS) voltage; and the digital filter of the power grid electric transient detector extracts transients of the RMS voltage.

15. The electric management system of claim 14, wherein:

the digital filter of the power grid electric transient detector further extracts transient events from the transients of the RMS voltage.

16. The electric management system of claim 11, wherein:

the measurement unit measures a plurality of electric parameters of the electricity received by the consuming facility;

the input of the power grid electric transient detector receives the plurality of electric parameters from the measurement unit;

the digital filter of the power grid electric transient detector extracts transients for each of the plurality of electric parameters; and the processor of the power grid electric transient detector analyzes the transients for each of the plurality of electric parameters and generates the power grid performance index based on the analyzed transients of the plurality of electric parameters.

17. The electric management system of claim 11, wherein:

the measurement unit further measures temperature, the temperature comprising at least one of the followings: a temperature inside the consuming facility, and a temperature outside the consuming facility;

the input of the electric provisioning unit further receives the measured temperature; and the processor of the electric provisioning unit analyzes the power grid performance index and the received temperature and manages electric provisioning of the consuming facility based on the analyzed power grid performance index and the received temperature.

* * * * *